(12) United States Patent
Kim et al.

(10) Patent No.: US 9,634,220 B2
(45) Date of Patent: *Apr. 25, 2017

(54) FABRICATION METHOD FOR SYNTHESIZING A $Bi_xSb_{2-x}Te_3$ THERMOELECTRIC NANOCOMPOUND AND THERMOELECTRIC NANOCOMPOUND THEREBY

(71) Applicant: Daegu Gyeongbuk Institute of Science & Technology, Daegu (KR)

(72) Inventors: Cham Kim, Daegu (KR); Dong Hwan Kim, Jinju-si (KR); Jong Tae Kim, Daegu (KR); Ji Hyeon Ahn, Changwon-si (KR); Ho Young Kim, Daegu (KR)

(73) Assignee: DAEGU GYEONGBUK INSTITUTE OF SCIENCE & TECHNOLOGY, Daegu (KR)

( * ) Notice: Subject to any disclaimer, the term of this patent is extended or adjusted under 35 U.S.C. 154(b) by 78 days.

This patent is subject to a terminal disclaimer.

(21) Appl. No.: 14/262,284

(22) Filed: Apr. 25, 2014

(65) Prior Publication Data

US 2014/0318590 A1 Oct. 30, 2014

(30) Foreign Application Priority Data

Apr. 30, 2013 (KR) .................. 10-2013-0048092

(51) Int. Cl.
*H01L 31/16* (2006.01)
*H01L 35/34* (2006.01)
*H01L 35/16* (2006.01)

(52) U.S. Cl.
CPC .............. *H01L 35/34* (2013.01); *H01L 35/16* (2013.01)

(58) Field of Classification Search
None
See application file for complete search history.

(56) References Cited

U.S. PATENT DOCUMENTS

2012/0273735 A1* 11/2012 Rowe .................... C04B 35/547
                                                                        252/519.4

FOREIGN PATENT DOCUMENTS

EP           0525890 A1 *  2/1993  ............. C01B 19/00
KR    10-2000-0025229           5/2000
(Continued)

OTHER PUBLICATIONS

Xu, et al., "Aqueous chemical synthesis of nanoscale Bi2(Te,Se)3 and (Bi,Sb)2Te3 thermoelectric compounds," Materials Letters, vol. 62 (Feb. 29, 2008), pp. 763-766.*

(Continued)

*Primary Examiner* — Allison Bourke
*Assistant Examiner* — William E McClain
(74) *Attorney, Agent, or Firm* — Lathrop & Gage LLP (57) ABSTRACT

The present invention provides a method for synthesizing a $Bi_xSb_{2-x}Te_3$ thermoelectric nanocompound (0<x<2), comprising the following steps: preparing a Bi—Sb—Te solution by adding Bi, Sb, and Te precursors to a solvent (step 1); preparing a Bi—Sb—Te hydrate by mixing the Bi—Sb—Te solution prepared in step 1) with a base aqueous solution (step 2); preparing a $Bi_xSb_{2-x}Te_3$ reactant by liquid phase reduction at room temperature after adding a reducing agent to the Bi—Sb—Te hydrate prepared in step 2) (step 3); aging the $Bi_xSb_{2-x}Te_3$ reactant prepared in step 3) (step 4); and preparing $Bi_xSb_{2-x}Te_3$ nanoparticles by filtering and drying the $Bi_xSb_{2-x}Te_3$ reactant aged in step 4) (step 5). The $Bi_xSb_{2-x}Te_3$ thermoelectric nanocompound synthesized by the method of the present invention via liquid phase reduction is composed of regular nanoparticles since the method (Continued)

does not need any additional heat-treatment to eliminate chemical additives and prevents particles from being overgrown. Therefore, the $Bi_xSb_{2-x}Te_3$ nanocompound particles are regular in size of 1~150 nm and distributed evenly, so that thermal conductivity of the compound is reduced and thereafter thermoelectric figure of merit thereof can be improved.

10 Claims, 4 Drawing Sheets

(56) References Cited

FOREIGN PATENT DOCUMENTS

| KR | 10-2005-0121189 | 12/2005 |
|---|---|---|
| KR | 10-0663975 | 12/2006 |
| KR | 10-2007-7012151 | 11/2007 |
| KR | 10-2007-0117270 | 12/2007 |
| KR | 10-2010-0053359 | 5/2010 |
| KR | 10-2013-0017589 | 2/2013 |

OTHER PUBLICATIONS

Sapp, et al., "Template Synthesis of Bismuth Telluride Nanowires," Advanced Materials, vol. 11 (1999), pp. 402-404.*

Kim, et al. "Significant enhancement in the thermoelectric performance of a bismuth telluride nanocompound through brief fabrication procedures." ACS applied materials & interfaces, vol. 4 (2012), pp. 2949-2954.*

Dhak, et al., "Characterization of nanocrystalline bismuth telluride (Bi2Te3) synthesized by a novel approach through aqueous precursor method", J. Am. Ceram. Soc., 89 (2006), 534-537.*

Nishiwaki, et al., "Synthesis of Bi2Te3 Nanosheets using Polyol Process", IOP Conf. Ser.: Mater. Sci. Eng., 18 (2011), 142009.*

Sun, et al., "Aqueous chemical reduction synthesis of Bi2Te3 nanowires with surfactant assistance", Mat. Lett., 60 (2006), 2534-2537.*

Kim, Cham, et al. "New Chemical Reaction Process of a Bi2Te2.7Se0. 3 Nanomaterial for Feasible Optimization in Transport Properties Resulting in Predominant n-Type Thermoelectric Performance." Industrial & Engineering Chemistry Research 55.19 (2016): 5623-5633.*

Datta, Anuja, et al. "Facile chemical synthesis of nanocrystalline thermoelectric alloys based on Bi—Sb—Te—Se." Crystal Growth & Design, 10.9 (2010): 3983-3989.*

Zhao, X. B., et al. "In-situ investigation and effect of additives on low temperature aqueous chemical synthesis of Bi 2 Te 3 nanocapsules." Journal of Materials Chemistry 15.16 (2005): 1621-1625.*

Cao, Y. Q., T. J. Zhu, and X. B. Zhao. "Thermoelectric Bi 2 Te 3 nanotubes synthesized by low-temperature aqueous chemical method." Journal of Alloys and Compounds, 449.1 (2008): 109-112.*

* cited by examiner

FABRICATION METHOD FOR SYNTHESIZING A $Bi_xSb_{2-x}Te_3$ THERMOELECTRIC NANOCOMPOUND AND THERMOELECTRIC NANOCOMPOUND THEREBY

CROSS-REFERENCE TO RELATED APPLICATIONS

This patent application claims the benefit of priority from Korean Patent Application No. 10-2013-0048092 filed on Apr. 30, 2013, the contents of which are incorporated herein by reference.

TECHNICAL FIELD

The present invention relates to a method for synthesizing a $Bi_xSb_{2-x}Te_3$ thermoelectric nanocompound and the thermoelectric nanocompound produced by the same.

BACKGROUND

Thermoelectric generation indicates the general technique to convert waste heat produced from everyday life and from a variety of industrial fields into electromotive force by using thermoelectric module. That is, it is the technique to convert thermal energy into electric energy by using Seebeck effect. Energy conversion efficiency of the said thermoelectric module depends on figure of merit (ZT) of thermoelectric material. Figure of merit of thermoelectric material, which is in other words thermoelectric figure of merit, is in proportion to temperature (T), and can be determined by Seebeck coefficient (a), electrical conductivity (a), and thermal conductivity (K) of each thermoelectric material (Mathematical Formula 1).

$$ZT=\alpha^2\sigma T/\kappa \qquad \text{(Mathematical Formula 1)}$$

(In the Mathematical Formula 1, ZT is the thermoelectric figure of merit, α is the Seebeck coefficient, σ is the electrical conductivity, T is the absolute temperature, and κ is the thermal conductivity.)

According to the Mathematical Formula 1, a substance having high electrical conductivity but low thermal conductivity is required to yield high thermoelectric figure of merit. In general, the smaller the size of a particle is, the lower the thermal conductivity goes. The smaller the number of crystal particle through which electric current flows, the higher the electrical conductivity goes. That is, thermoelectric figure of merit can be improved by regulating the crystal growth.

For example, Korean Patent Publication No. 2000-0025229, No. 10-2007-0117270, and No. 10-2010-0053359 describe methods for preparing thermoelectric materials in bulk with improved thermoelectric properties by mechanical milling-mixing. More precisely in those methods, the starting materials Bi and Te were dissolved and hardened, followed by pulverization to give $Bi_2Te_3$ elemental powder. Then, the elemental powder proceeded to mechanical grinding to give thermoelectric materials. However, the thermoelectric materials prepared by the above methods have the disadvantage of high thermal conductivity resulted from the particle size in tens of micro-meters.

Korean Patent Publication No. 10-2005-0121189 presents a method for preparing (BiSb)(TeSe) thermoelectric material by melt-spinning and extruding. Particularly, Sb and Se were inserted in BiTe thermoelectric materials to prepare the thermoelectric materials having p-/n-type characteristics. However, the thermoelectric materials prepared by the above method also have the disadvantage of high thermal conductivity owing to the particle size in tens of micrometers.

In the meantime, Japanese Patent Publication No. 22093024 presents a method for preparing BiTe alloy nanoparticles, in which the Bi precursor $BiCl_3$ and Te were dispersed and reduced in water and then reacted to give $Bi_2Te_3$ nanoparticles. However, even though the $Bi_2Te_3$ nanoparticles presented in the patent were confirmed to have low thermal conductivity, dispersing agents or reducing agents used in the process were acting as impurities or oxide second phase was produced. Besides, the product is the binary material, which means it does not have enough extrinsic semiconductor properties, so that it is difficult to apply the product to thermoelectric module.

Korean Patent Publication No. 10-2007-0108853 presents a method for preparing nanocomposite designed to decrease thermal conductivity. Particularly, Si nanoparticles having thermoelectric properties were included in Ge host (inclusion), by which electrical conductivity of the complex was kept but thermal conductivity was lowered. The said Si particles are in the size of tens of nano-meters. So, this particles have lower lattice thermal conductivity reduced by phonon comparatively decreased, compared with other particles in the size of tens of micro-meters. However, this thermoelectric composite demonstrates the highest thermoelectric figure of merit in mid-temperature range (around 600 K), and has the disadvantage of requiring high priced raw materials such as Si and Ge.

Korean Patent No. 10-0663975 also describes a method for preparing Fe-doped skutterudite thermoelectric material. Particularly, this method is to reduce thermal conductivity of a thermoelectric material by taking advantage of rattling effect of a specific atom, in which lattice thermal conductivity of each material, crystalline skutterudite and clathrate, can be reduced by inserting rare earth metals and alkali metals in the internal void of the said materials having high electrical conductivity. However, the said skutterudite and clathrate demonstrate the highest thermoelectric figure of merit in mid-high temperature range (higher than 600 K), suggesting that high-temperature/high-pressure process is required.

Lastly, Korean Patent Publication No. 10-2013-0017589 presents a method for synthesizing a $Bi_xSb_{2-x}Te_3$ thermoelectric nanocompound. Particularly, cation precursors (Bi and Sb) and an anion precursor (Te) were dissolved in a solvent, followed by reaction to give $Bi_xSb_{2-x}Te_3$ nanoparticles. However, according to this method, heat treatment is necessary to eliminate chemical additives used in the process of synthesizing $Bi_xSb_{2-x}Te_3$ nanoparticles, suggesting that particles are apt to grow, resulting in the increase of thermal conductivity.

In the course of study to develop a new method for synthesizing a $Bi_xSb_{2-x}Te_3$ nanocompound with improved thermoelectric properties, the present inventors confirmed that a $Bi_xSb_{2-x}Te_3$ nanocompound could be synthesized by liquid phase reduction and this method did not require additional heat treatment to eliminate the added chemicals with preventing nanoparticles from growing, that is even nanoparticles could be formed. The present inventors further confirmed that the synthesized $Bi_xSb_{2-x}Te_3$ nanocompound had reduced thermal conductivity. Based on the above confirmation, the present inventors developed a method for synthesizing a $Bi_xSb_{2-x}Te_3$ thermoelectric nanocompound with improved thermoelectric figure of merit, leading to the completion of this invention.

SUMMARY OF THE INVENTION

Technical Problem

It is an object of the present invention to provide a method for synthesizing a $Bi_xSb_{2-x}Te_3$ thermoelectric nanocompound and the thermoelectric nanocompound produced by the same.

Technical Solution

To achieve the above object, the present invention provides a method for synthesizing a $Bi_xSb_{2-x}Te_3$ thermoelectric nanocompound (0<x<2), comprising the following steps:

preparing a Bi—Sb—Te solution by adding Bi, Sb, and Te precursors to a solvent (step 1);

preparing a Bi—Sb—Te hydrate by mixing the Bi—Sb—Te solution prepared in step 1) with a base aqueous solution (step 2);

preparing a $Bi_xSb_{2-x}Te_3$ reactant by liquid phase reduction at room temperature after adding a reducing agent to the Bi—Sb—Te hydrate prepared in step 2) (step 3);

aging the $Bi_xSb_{2-x}Te_3$ reactant prepared in step 3) (step 4); and preparing $Bi_xSb_{2-x}Te_3$ nanoparticles by filtering and drying the $Bi_xSb_{2-x}Te_3$ reactant aged in step 4) (step 5).

The present invention also provides the $Bi_xSb_{2-x}Te_3$ thermoelectric nanocompound prepared by the said method above.

Advantageous Effects

The method for synthesizing a $Bi_xSb_{2-x}Te_3$ thermoelectric nanocompound of the present invention has advantageous effect of synthesizing a $Bi_xSb_{2-x}Te_3$ nanocompound by liquid phase reduction and of preparing even and regular nanoparticles with preventing them from further growing without an additional heat-treatment to eliminate chemical additives. When $Bi_xSb_{2-x}Te_3$ nanocompound particles are produced evenly in the size of 1~150 nm, thermal conductivity of the nanocompound is reduced and at last thermoelectric figure of merit is improved.

BRIEF DESCRIPTION OF THE DRAWINGS

The application of the preferred embodiments of the present invention is best understood with reference to the accompanying drawings, wherein.

DETAILED DESCRIPTION OF THE INVENTION

Hereinafter, the present invention is described in detail.

The present invention provides a method for synthesizing a $Bi_xSb_{2-x}Te_3$ thermoelectric nanocompound (0<x<2), comprising the following steps:

preparing a Bi—Sb—Te solution by adding Bi, Sb, and Te precursors to a solvent (step 1);

preparing a Bi—Sb—Te hydrate by mixing the Bi—Sb—Te solution prepared in step 1) with a base aqueous solution (step 2);

preparing a $Bi_xSb_{2-x}Te_3$ reactant by liquid phase reduction at room temperature after adding a reducing agent to the Bi—Sb—Te hydrate prepared in step 2) (step 3);

aging the $Bi_xSb_{2-x}Te_3$ reactant prepared in step 3) (step 4); and preparing $Bi_xSb_{2-x}Te_3$ nanoparticles by filtering and drying the $Bi_xSb_{2-x}Te_3$ reactant aged in step 4) (step 5).

Figure 1:
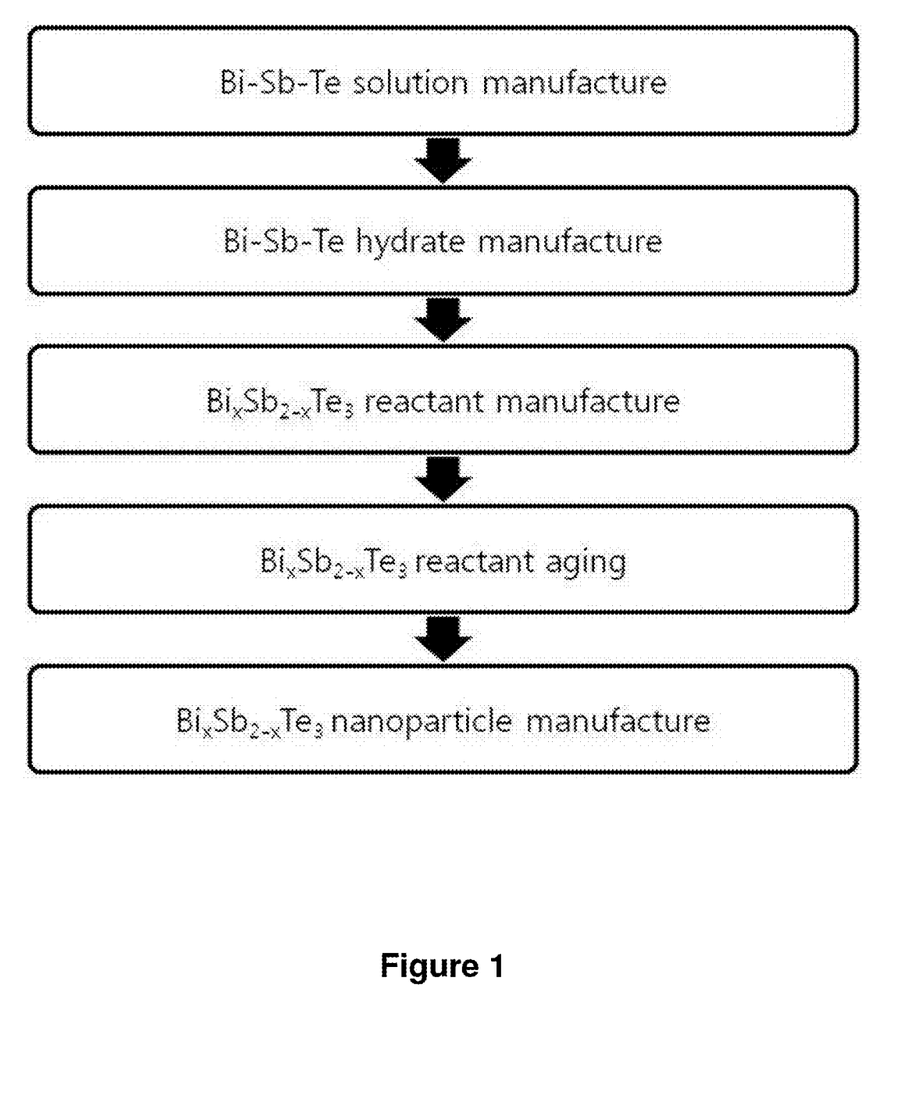
FIG. 1 is a process flow chart illustrating the method for synthesizing a $Bi_xSb_{2-x}Te_3$ thermoelectric nanocompound according to the present invention.

The present invention presents the summary of the above method for synthesizing a $Bi_xSb_{2-x}Te_3$ thermoelectric nanocompound with a process flow chart in FIG. 1.

Hereinafter, the method for synthesizing a $Bi_xSb_{2-x}Te_3$ thermoelectric nanocompound of the present invention is described in more detail step by step based on the process flow chart shown in FIG. 1.

In the method for synthesizing a $Bi_xSb_{2-x}Te_3$ thermoelectric nanocompound of the present invention, step 1) is to prepare a Bi—Sb—Te solution by adding Bi, Sb, and Te precursors to a solvent.

In step 1, the Bi precursor can be selected from the group consisting of Bi, $Bi(NO_3)_3$, $BiCl_3$, $BiBr_3$, $BiI_3$, and $BiF_3$.

In step 1, the Sb precursor can be selected from the group consisting of Sb, $Sb(NO3)_3$, $SbCl_3$, $SbCl_5$, $SbBr_3$, and $SbF_3$.

In step 1, the Te precursor can be selected from the group consisting of Te, $TeCl_4$, $H_2TeO_3$, and $H_2TeO_4$.

In step 1, the solvent can be an acid aqueous solution. Herein the acid can be selected from the group consisting of hydrochloric acid, nitric acid, sulfuric acid, and aqua regia.

The said Bi, Sb, and Te precursors were mixed with the solvent, followed by stirring to prepare a Bi—Sb—Te solution.

In the method for synthesizing a $Bi_xSb_{2-x}Te_3$ thermoelectric nanocompound of the present invention, step 2) is to prepare a hydrate by mixing the Bi—Sb—Te solution prepared in step 1) with a base aqueous solution.

In step 2, a hydrate can be prepared in order to prepare a $Bi_xSb_{2-x}Te_3$ nanocompound via liquid phase reduction.

In step 2), the base aqueous solution can be selected from the group consisting of sodium hydroxide, potassium hydroxide, and ammonium hydroxide.

In this step, the Bi—Sb—Te solution prepared in step 1) was mixed with a base aqueous solution in order to hydrate Bi—Sb—Te. The Bi—Sb—Te hydrate was prepared by stirring the mixture for 6~24 hours.

In the method for synthesizing a $Bi_xSb_{2-x}Te_3$ thermoelectric nanocompound of the present invention, step 3) is to prepare a $Bi_xSb_{2-x}Te_3$ reactant by liquid phase reduction after adding a reducing agent to the Bi—Sb—Te hydrate prepared in step 2).

A $Bi_xSb_{2-x}Te_3$ nanocompound was synthesized by liquid phase reduction in step 3). In this process, any additional heat-treatment was not necessary to eliminate chemical additives, suggesting that nanoparticles were evenly formed without being over-grown. As a result, the $Bi_xSb_{2-x}Te_3$ nanocompound particles were regular in size that was in the range of 1~150 nm, and evenly distributed, so that thermal conductivity of the $Bi_xSb_{2-x}Te_3$ nanocompound was reduced and at last thermoelectric figure of merit was increased.

The reducing agent in step 3) can be selected from the group consisting of $LiAlH_4$, $H_6B_2$, $NaBH_4$, and $N_2H_4$.

In the method for synthesizing a $Bi_xSb_{2-x}Te_3$ thermoelectric nanocompound of the present invention, step 4) is the process of aging the $Bi_xSb_{2-x}Te_3$ reactant prepared in step 3).

The said aging was performed at room temperature with stirring for 12~48 hours. When the stirring for aging is performed less than 12 hours, the Bi—Sb—Te hydrate is not reduced, and therefore other phases except $Bi_xSb_{2-x}Te_3$, particularly $Bi_2O_3$, $SbO_3$, and $TeO_2$ can be produced.

In the method for synthesizing a $Bi_xSb_{2-x}Te_3$ thermoelectric nanocompound of the present invention, step 5) is to filter and dry the $Bi_xSb_{2-x}Te_3$ reactant finished with aging in step 4) to give $Bi_xSb_{2-x}Te_3$ nanoparticles.

In step 5), filtering was performed to recover the $Bi_xSb_{2-x}Te_3$ reactant finished with aging from the solvent. After filtered, the recovered $Bi_xSb_{2-x}Te_3$ reactant was washed with alcohol, acetone, and deionized water, etc, and then dried. Drying was performed at 40~80° C. for 6~24 hours, and preferably performed at 60° C. for 12 hours under vacuum condition.

As a result, $Bi_xSb_{2-x}Te_3$ nanoparticles (0<x<2) were obtained. The particle size of the $Bi_xSb_{2-x}Te_3$ nanoparticle was 1~150 nm, and the particle size distribution was ±20%, more preferably ±10%. When the particle size distribution is in the above range, physical and chemical properties of the nanoparticle are excellent.

The method for synthesizing a $Bi_xSb_{2-x}Te_3$ thermoelectric nanocompound of the present invention is advantageous in synthesis of a $Bi_xSb_{2-x}Te_3$ nanocompound via liquid phase reduction since it does not require any additional heat-treatment process to eliminate chemical additives. By omitting the heat-treatment, particles are prevented from being over-grown so as to form even and regular nanoparticles. Therefore, the $Bi_xSb_{2-x}Te_3$ nanocompound particles prepared by the method comprising steps 1)~5) above are formed regularly in the size of 1~150 nm and distributed evenly. As a result, thermal conductivity of the $Bi_xSb_{2-x}Te_3$ nanocompound is reduced but thermoelectric figure of merit thereof is improved.

The present invention also provides the $Bi_xSb_{2-x}Te_3$ thermoelectric nanocompound prepared by the said method above.

At this time, the said $Bi_xSb_{2-x}Te_3$ nanocompound preferably has the rhombohedral structure.

The particle size of the said $Bi_xSb_{2-x}Te_3$ nanocompound is 1~150 nm and the particle size distribution thereof is ±20% and more preferably ±10%.

The $Bi_xSb_{2-x}Te_3$ thermoelectric nanocompound of the present invention is synthesized by liquid phase reduction without additional heat-treatment process, which is advantageous in preparing even nanoparticles without being over-grown. That is, the method of the present invention facilitates the synthesis of a $Bi_xSb_{2-x}Te_3$ nanocompound in the diameter of 1~150 nm, in which nanoparticles are regular and evenly distributed so that lattice thermal conductivity of the $Bi_xSb_{2-x}Te_3$ nanocompound can be reduced by active phonon scattering thereby. That indicates thermoelectric figure of merit is increased, making the nanocompound excellent material for thermoelectric module.

EXAMPLES

Practical and presently preferred embodiments of the present invention are illustrative as shown in the following Examples.

However, it will be appreciated that those skilled in the art, on consideration of this disclosure, may make modifications and improvements within the spirit and scope of the present invention.

Example 1

Preparation of a $Bi_xSb_{2-x}Te_3$ Thermoelectric Nanocompound 1

A $Bi_{0.5}Sb_{1.5}Te_3$ nanocompound was prepared by the method comprising the following steps:

Step 1: 15 mmol of Bi, 45 mmol of Sb, and 90 mmol of Te were mixed in distilled water, to which 100 ml of nitric acid was added, followed by stirring for 3 hours. As a result, a Bi—Sb—Te solution was prepared.

Step 2: Ammonium hydroxide, the base aqueous solution, was added to the Bi—Sb—Te solution prepared in step 1) until pH reached 7.0 in order to hydrate Bi—Sb—Te. The mixture was stirred for approximately 12 hours to give a Bi—Sb—Te hydrate.

Step 3: 50 ml of $N_2H_4$, the reducing agent, was added to the Bi—Sb—Te hydrate prepared in step 2), followed by liquid phase reduction with the Bi—Sb—Te hydrate. As a result, a $Bi_{0.5}Sb_{1.5}Te_3$ reactant was prepared.

Step 4: Aging was performed by stirring the $Bi_{0.5}Sb_{1.5}Te_3$ reactant prepared in step 3) at room temperature for 24 hours.

Step 5: The $Bi_{0.5}Sb_{1.5}Te_3$ reactant finished with aging in step 4) was recovered by filtering, which was then washed with ethanol and distilled water. The washed $Bi_{0.5}Sb_{1.5}Te_3$ reactant was dried at 60° C. for 12 hours under vacuum condition to give a $Bi_{0.5}Sb_{1.5}Te_3$ nanocompound.

Comparative Example 1

Preparation of a $Bi_xSb_{2-x}Te_3$ Thermoelectric Nanocompound 2

Step 1: 15 mmol of $Bi(NO_3)_3$ and 45 mmol of $SbCl_3$ were added to ethylene glycol, followed by stirring for approximately 2 hours to give a Bi—Sb solution.

Step 2: 90 mmol of Te powder was added to ethylene glycol, to which nitric acid was added to prepare a Te solution.

Step 3: The Bi—Sb solution prepared in step 1) was mixed with the Te solution prepared in step 2), followed by aging at 280° C. for 24 hours.

Step 4: The reactant finished with aging in step 3) was cooled down naturally, followed by filtering to recover the reactant. The recovered reactant was washed with ethanol, acetone, and distilled water. The reactant was dried at 60° C. for 12 hours under vacuum condition to give $Bi_{0.5}Sb_{1.5}Te_3$ nanoparticles.

Step 5: The $Bi_{0.5}Sb_{1.5}Te_3$ nanoparticles obtained in step 4) were heated in hydrogen ambient at heating rate of 5° C./minute, followed by heat-treatment at 300° C. for 6 hours.

Experimental Example 1

X-Ray Diffraction Analysis

Figure 2:
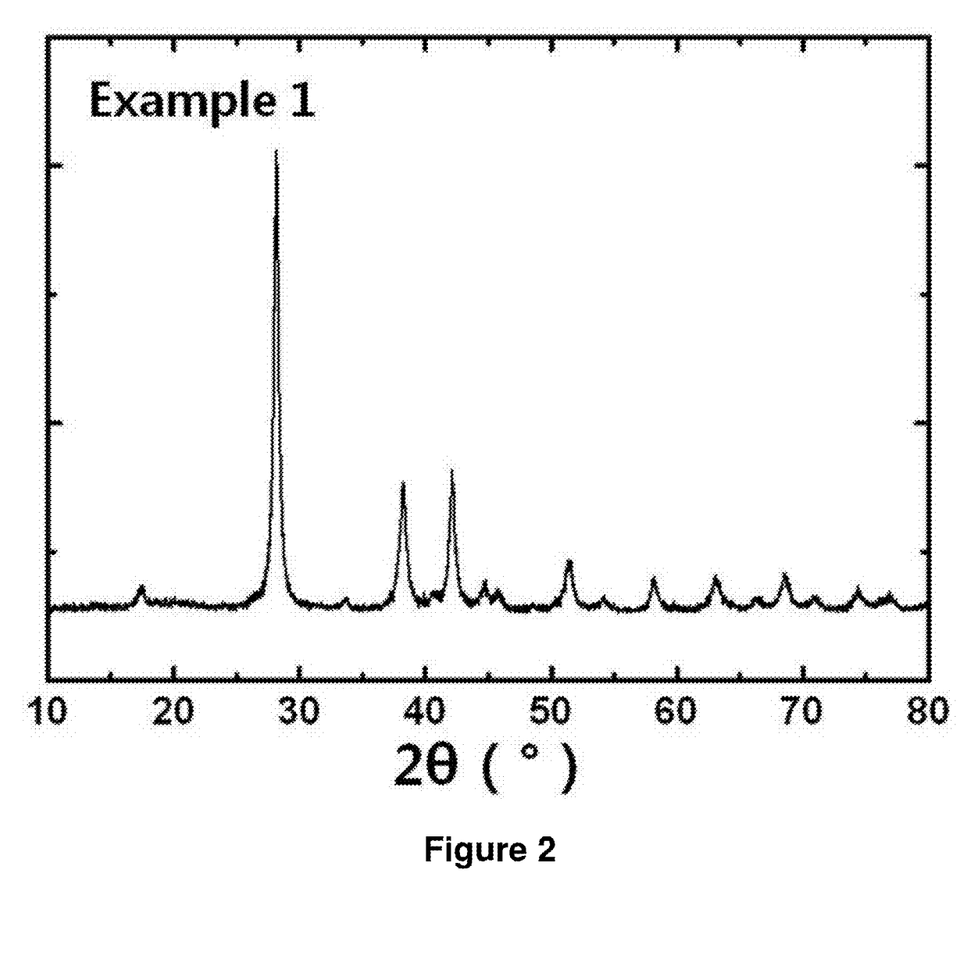
FIG. 2 is a graph illustrating the result of X-ray diffraction analysis (XRD) with the $Bi_xSb_{2-x}Te_3$ thermoelectric nanocompound prepared in Example 1.

To confirm the structure of the $Bi_{0.5}Sb_{1.5}Te_3$ thermoelectric nanocompound prepared in Example 1, X-ray diffraction (XRD, Rigaku, D/MAX-2500) was performed and the result is presented in FIG. 2.

As shown in FIG. 2, it was confirmed that the said $Bi_{0.5}Sb_{1.5}Te_3$ thermoelectric nanocompound had the rhombohedral structure. Therefore, it was confirmed that the $Bi_xSb_{2-x}Te_3$ thermoelectric nanocompound was successfully synthesized by the method of the present invention.

Experimental Example 2

Observation Under Scanning Electron Microscope

Figure 3:
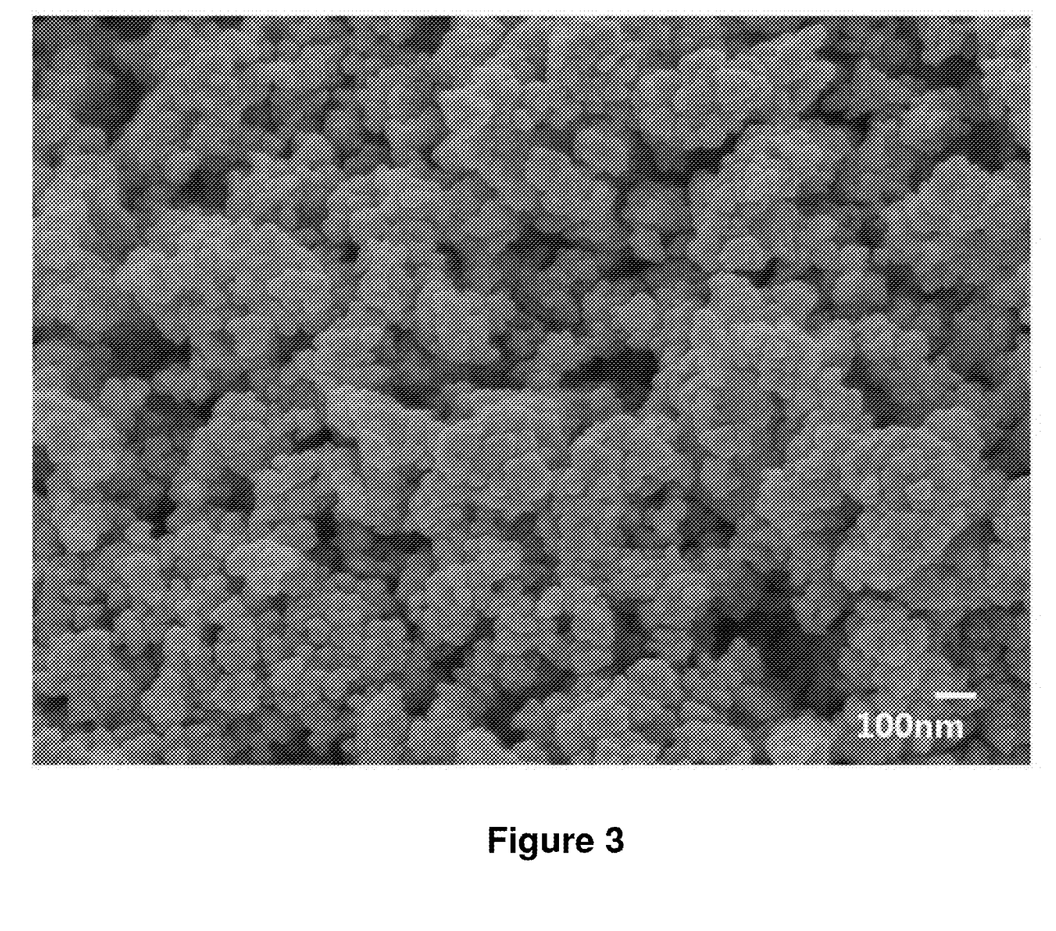
FIG. 3 is a scanning electron microscope image illustrating the $Bi_xSb_{2-x}Te_3$ thermoelectric nanocompound prepared in Example 1.

The surface of the $Bi_{0.5}Sb_{1.5}Te_3$ thermoelectric nanocompound prepared in Example 1 was observed under scanning electron microscope (SEM, Hitachi, S-4800) and the result is presented in FIG. 3.

As shown in FIG. 3, the said $Bi_{0.5}Sb_{1.5}Te_3$ thermoelectric nanocompound was confirmed to be composed of nanoparticles in the diameter of 50~100 nm.

Therefore, it was confirmed that the method for synthesizing a $Bi_xSb_{2-x}Te_3$ thermoelectric nanocompound of the present invention characterized by liquid phase reduction without additional heat-treatment facilitates the production of finer even nanoparticles with preventing them from further growing.

Experimental Example 3

Measurement of Thermal Conductivity

Figure 4:
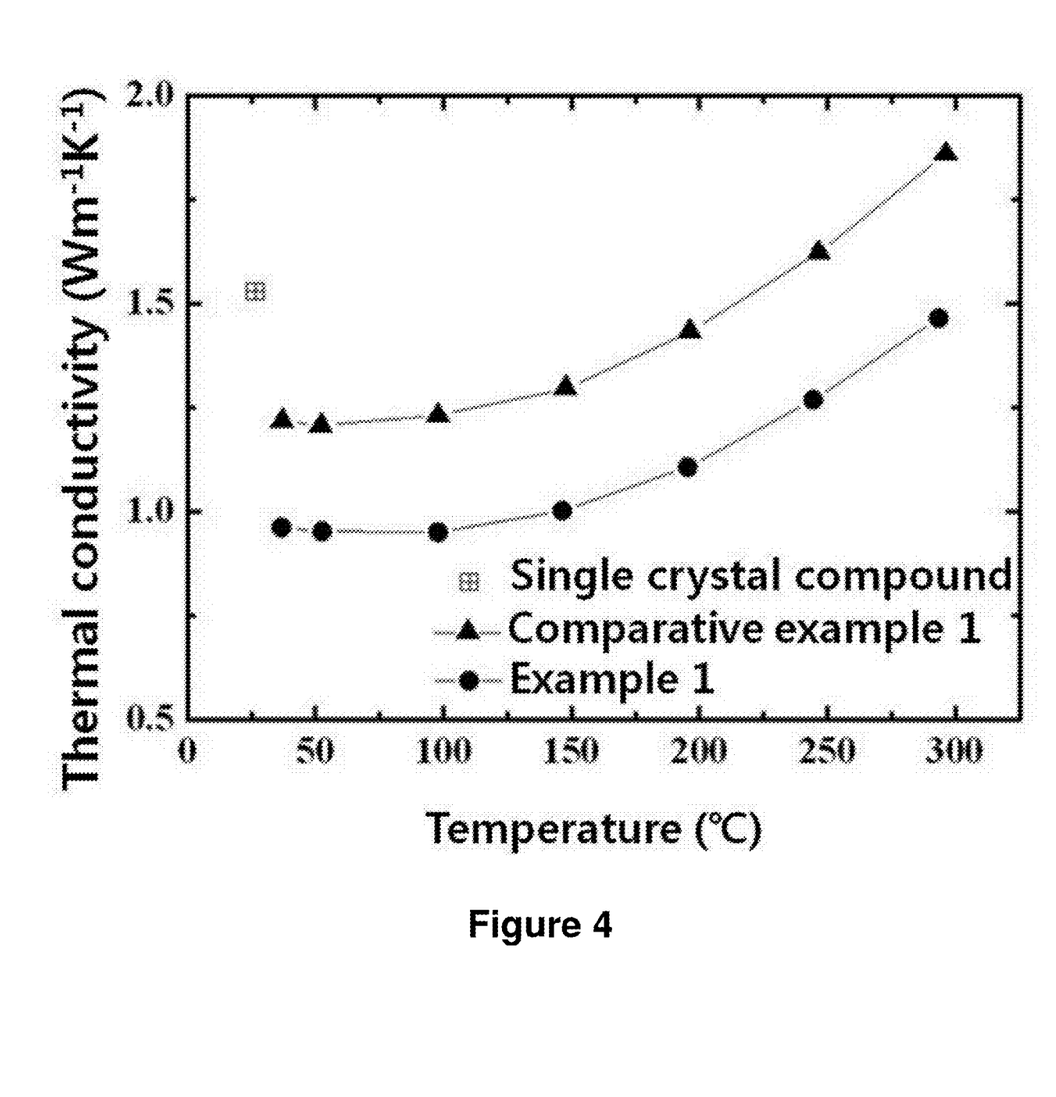
FIG. 4 is a graph illustrating the thermal conductivities of the $Bi_xSb_{2-x}Te_3$ thermoelectric nanocompounds prepared in Example 1 and Comparative Example 1.

To investigate any changes in thermoelectric figure of merit of the $Bi_{0.5}Sb_{1.5}Te_3$ thermoelectric nanocompound prepared in Example 1, thermal conductivity was measured by laser flash analysis (LFA, Netzsch, LFA447) and the result is presented in FIG. 4.

As shown in FIG. 4, thermal conductivity of the said $Bi_{0.5}Sb_{1.5}Te_3$ thermoelectric nanocompound was approximately 1.0 $Wm^{-1}K^{-1}$ at 50° C. and approximately 1.5 $Wm^{-1}K^{-1}$ at 300° C.

In the meantime, thermal conductivity of the $Bi_{0.5}Sb_{1.5}Te_3$ thermoelectric nanocompound prepared in Comparative Example 1 was approximately 1.25 $Wm^{-1}K^{-1}$ at the temperature range of 50~150° C. and around 2.0 $Wm^{-1}K^{-1}$ at 300° C.

From the above results, it was confirmed that thermal conductivity of the $Bi_{0.5}Sb_{1.5}Te_3$ thermoelectric nanocompound prepared by the method of the present invention was lower than that of the conventional $Bi_{0.5}Sb_{1.5}Te_3$ thermoelectric nanocompound prepared by the conventional method.

It was further confirmed that the $Bi_{0.5}Sb_{1.5}Te_3$ thermoelectric nanocompound prepared in Example 1 had much lower thermal conductivity than that of the single crystal compound composed of micrometer-sized particles (sc-$Bi_xSb_{2-x}Te_3$, Thermoelectrics Handbook: Macro to Nano, CRC/Taylor & Francis, Boca Raton, 2006).

According to the method for synthesizing a $Bi_xSb_{2-x}Te_3$ thermoelectric nanocompound of the present invention, lattice thermal conductivity of the above $Bi_{0.5}Sb_{1.5}Te_3$ thermoelectric nanocompound was also confirmed to be reduced owing to the active phonon scattering among nanoparticles.

Therefore, the $Bi_xSb_{2-x}Te_3$ nanoparticles prepared in the finer size according to the method of the present invention demonstrated much lower thermal conductivity.

The $Bi_xSb_{2-x}Te_3$ nanocompound having lower thermal conductivity demonstrates higher thermoelectric figure of merit as calculated by the following Mathematical Formula 1, suggesting that the said nanocompound can be effectively used as a material for thermoelectric module.

$$ZT=\alpha^2\sigma T/\kappa \quad \text{(Mathematical Formula 1)}$$

(In the Mathematical Formula 1, ZT is the thermoelectric figure of merit, α is the Seebeck coefficient, σ is the electrical conductivity, T is the absolute temperature, and κ is the thermal conductivity.)

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

The invention claimed is:

1. A method for synthesizing a $Bi_xSb_{2-x}Te_3$ thermoelectric nanocompound (0<x<2), comprising the following steps:
   preparing a Bi—Sb—Te solution by adding Bi, Sb, and Te precursors to a solvent (step 1);
   preparing a Bi—Sb—Te hydrate by mixing the Bi—Sb—Te solution prepared in step 1) with a base aqueous solution until a pH of 7.0 is reached (step 2);
   preparing a $Bi_xSb_{2-x}Te_3$ reactant by liquid phase reduction by adding a reducing agent to the Bi—Sb—Te hydrate prepared in step 2) (step 3);
   aging the $Bi_xSb_{2-x}Te_3$ reactant prepared in step 3) by stirring the mixture for 12 to 24 hours (step 4); and
   preparing $Bi_xSb_{2-x}Te_3$ nanoparticles by filtering and drying the $Bi_xSb_{2-x}Te_3$ reactant aged in step 4) (step 5),
   wherein the solvent of step 1) is a nitric acid aqueous solution, wherein the nitric acid is provided in stoichiometric excess compared to the Bi, Sb, and Te precursors, and
   wherein step 1) through step 4) are performed at room temperature.

2. The method for synthesizing a $Bi_xSb_{2-x}Te_3$ thermoelectric nanocompound according to claim 1, wherein the Bi precursor of step 1) is one or more substances selected from the group consisting of Bi, $Bi(NO_3)_3$, $BiCl_3$, $BiBr_3$, $BiI_3$, and $BiF_3$.

3. The method for synthesizing a $Bi_xSb_{2-x}Te_3$ thermoelectric nanocompound according to claim 1, wherein the Sb precursor of step 1) is one or more substances selected from the group consisting of Sb, $Sb(NO_3)_3$, $SbCl_3$, $SbCl_5$, $SbBr_3$, and $SbF_3$.

4. The method for synthesizing a $Bi_xSb_{2-x}Te_3$ thermoelectric nanocompound according to claim 1, wherein the Te precursor of step 1) is one or more substances selected from the group consisting of Te, $TeCl_4$, $H_2TeO_3$, and $H_2TeO_4$.

5. The method for synthesizing a $Bi_xSb_{2-x}Te_3$ thermoelectric nanocompound according to claim 1, wherein the base aqueous solution of step 2) is one or more solutions selected from the group consisting of sodium hydroxide, potassium hydroxide, ammonium hydroxide.

6. The method for synthesizing a $Bi_xSb_{2-x}Te_3$ thermoelectric nanocompound according to claim 1, wherein the reducing agent of step 3) is one or more substances selected from the group consisting of $LiAlH_4$, $H_6B_2$, $NaBH_4$, and $N_2H_4$.

7. The method for synthesizing a $Bi_xSb_{2-x}Te_3$ thermoelectric nanocompound according to claim 1, wherein the step of washing the reactant is additionally included after filtering the reactant in step 5).

8. The method for synthesizing a $Bi_xSb_{2-x}Te_3$ thermoelectric nanocompound according to claim 7, wherein the washing is performed with one or more washing solutions selected from the group consisting of alcohol, acetone, and deionized water.

9. The method for synthesizing a $Bi_xSb_{2-x}Te_3$ thermoelectric nanocompound according to claim 1, wherein the drying in step 5) is performed at 40~80° C.

10. The method for synthesizing a $Bi_xSb_{2-x}Te_3$ thermoelectric nanocompound according to claim 1, wherein the drying in step 5) is performed for 6~24 hours.

* * * * *